United States Patent [19]

Desai et al.

[11] 4,157,507

[45] Jun. 5, 1979

[54] ELECTRONIC SYSTEM FOR DETECTING DIRECTION OF MOTION

[75] Inventors: Ashok K. Desai, Chatsworth; Bipinchandra V. Gami, Woodland Hills; Eric M. Dunstan, Hidden Hills, all of Calif.

[73] Assignee: Pertec Corporation, El Segundo, Calif.

[21] Appl. No.: 912,405

[22] Filed: Jun. 5, 1978

Related U.S. Application Data

[63] Continuation of Ser. No. 795,100, May 9, 1977, abandoned.

[51] Int. Cl.$^2$ .................. G01R 19/14; H03K 5/20
[52] U.S. Cl. .................................. 328/134; 328/166; 324/83 Q; 324/86
[58] Field of Search ............... 328/133, 134, 166; 324/83 Q, 86

[56] References Cited

U.S. PATENT DOCUMENTS

| | | | |
|---|---|---|---|
| 2,971,086 | 2/1961 | Feijoo et al. | 324/83 Q |
| 3,069,623 | 12/1962 | Mugio | 328/134 X |
| 3,233,180 | 2/1966 | Eddy | 328/134 |
| 3,501,701 | 3/1970 | Reid | 328/134 |
| 3,579,268 | 5/1971 | Steiger | 328/166 X |
| 3,588,710 | 6/1971 | Masters | 328/133 |

Primary Examiner—John S. Heyman
Attorney, Agent, or Firm—Freilich, Hornbaker, Wasserman, Rosen & Fernandez

[57] ABSTRACT

Apparatus for detecting the direction of motion from a reference signal, R, and a quadrature signal, Q, derived from the output signals X+0 and X+90 of a position transducer, wherein the polarity of the reference signal alternates with every fixed increment of motion of a transducer and the quadrature signal which maintains phase difference of +90° or −90° with respect to the reference signal depending on the direction of motion, is comprised of: digital means for producing a narrow pulse, P, at each low-to-high transition of the quadrature signal and a narrow pulse, N, at each high-to-low transition of the quadrature signal; means for determining the direction of motion from these narrow pulses and the reference signal once during each half cycle of the reference signal, and means for storing this direction information until a subsequent determination is made in order to provide a continuous signal indicating the direction of motion.

3 Claims, 3 Drawing Figures

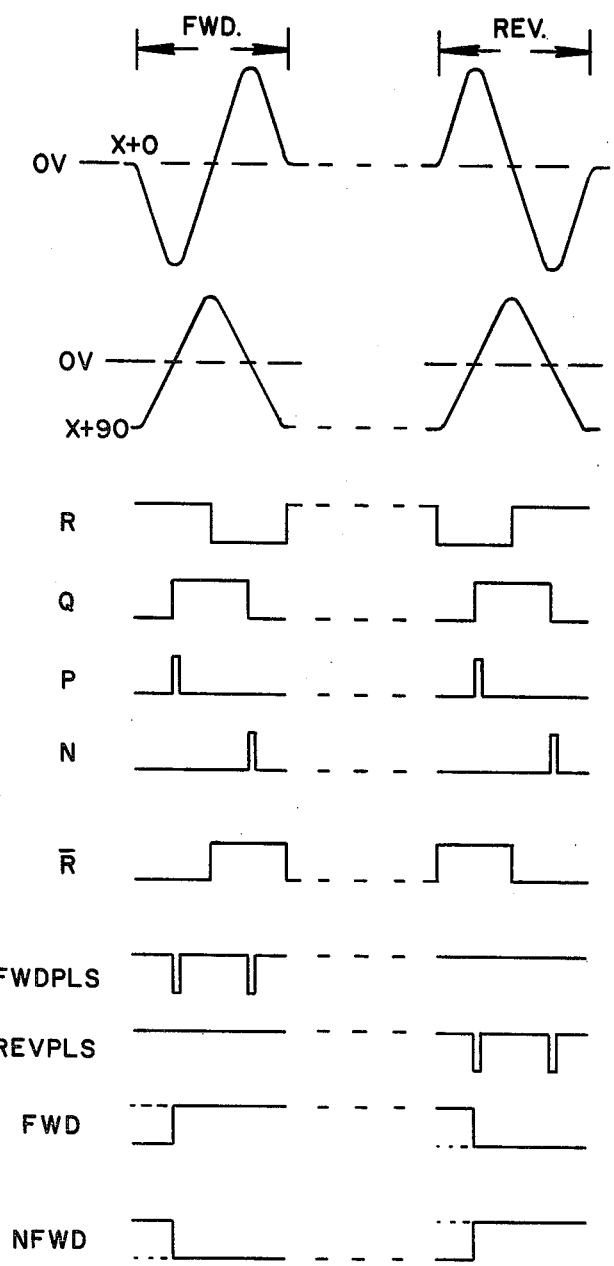

ELECTRONIC SYSTEM FOR DETECTING DIRECTION OF MOTION

This is a continuation, of application Ser. No. 795,100, filed May 9, 1977 now abandoned.

BACKGROUND OF THE INVENTION

This invention relates to transducers for measuring motion and its direction, and in particular to a logic network for determining the direction of motion from the outputs of a position transducer.

The concept of providing electronic velocity feedback by generating a pulse train of fixed pulse width, using an optical tachometer or optical encoder, is well known. An optical encoder consists of a grid or scale of dark and transparent lines on a glass plate attached to a driven member, and two sections of corresponding grids on a stationary reticle. One section of reticle is spatially displaced from the other, and relative to the scale, one quarter of a line space so that when light is transmitted through the scale and the two reticles onto light sensors, the light detected by each sensor is modulated 90° out of phase.

Quasi-sinusoidal output signals are produced by the light sensors with a frequency that is a direct function of the number of lines of the scale passing a fixed point per unit time. A pulse train may be derived from these quasi-sinusoidal output signals and converted to a velocity feedback signal of an amplitude linearly proportional to frequency.

The feedback voltage signal generated in such systems is proportional to the modulus of velocity and does not have any information as to the direction of motion. In many applications, the true direction of motion is crucial in order to apply the proper polarity of velocity feedback. What is required is a low cost system for determining from the quasi-sinusoidal signals the direction of any motion over less than one half the line spacing of the grids in the scale and reticles (typically 100 to 200 lines per inch).

SUMMARY OF THE INVENTION

An electronic system for detecting the direction of motion operating on two alternating signals from two position transducers spatially displaced by 90° is comprised of separate means for converting each of the alternating signals into logic signals of one voltage level for each half cycle of one polarity and of another voltage level for each half cycle of opposite polarity, thereby producing a squarewave reference signal, R, from one alternating signal and a squarewave quadrature signal, Q, from the other alternating signal. The latter is ±90° out of phase with the reference signal depending upon the direction of motion. The quadrature signal is further conditioned by circuit means for producing a pulse, P, at each transition of a given polarity (direction of transition from one logic level to the other) and a pulse, N, at each transition of opposite polarity. Logic means respond to the reference signal R and to the pulses P and N to produce a forward signal, FWDPLS, for one phase relationship of the signals R and Q associated with forward motion according to the logic function $$FWDPLS = RP + \overline{R}N$$

Additional logic means respond to the signal R and to the pulses P and N to produce a reverse signal, REVPLS, for the other phase relationship of the signals R and Q associated with reverse motion according to the logic function $$REVPLS = RN + \overline{R}P.$$

Since these forward and reverse signals are pulse signals, a bistable means is provided to store each pulse of the forward signal, thereby to provide a steady-state output signal FWD in response to each pulse in the forward signal, and to store each pulse of the reverse signal, to provide a complementary steady-state output signal NFWD in response to each pulse in the reverse signal. The signal NFWD is true whenever the signal FWD is not true and vice versa. The signal FWD is therefore true for motion in one direction and the signal NFWD is true for motion in the opposite direction. At any time that motion is stopped, the signal indicating the last direction of motion remains stored in the bistable means until motion again occurs. The direction of any motion is determined in an average of a quarter cycle of the quadrature signal, but no more than one half cycle of the quadrature signal.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 3 is a timing diagram which illustrates the operation of the logic network of FIG. 2.

DESCRIPTION OF PREFERRED EMBODIMENTS

Figure 1:
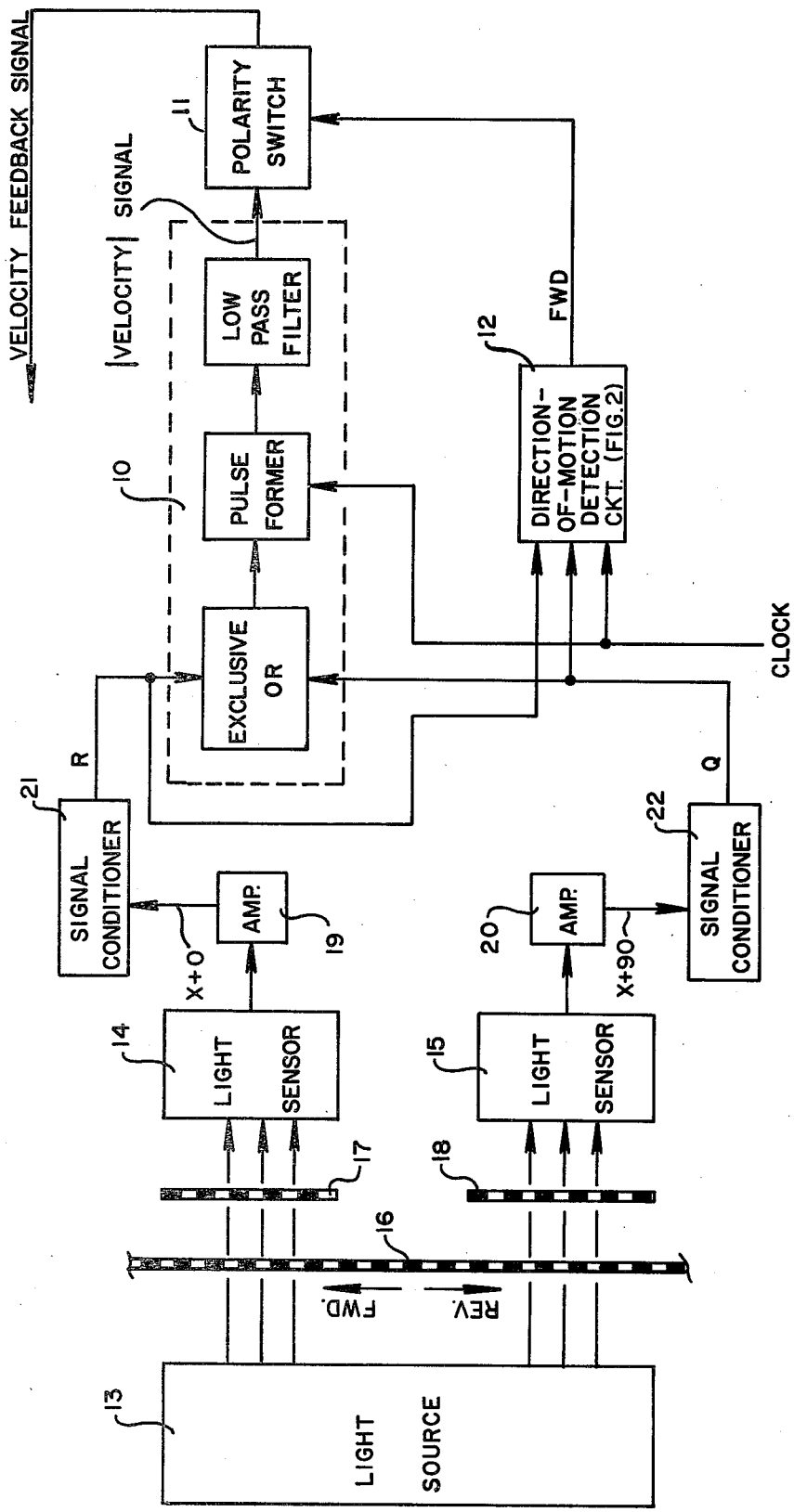
FIG. 1 illustrates schematically a conventional motion transducer and signal conditioner in a typical application of the present invention.
Figure 2:
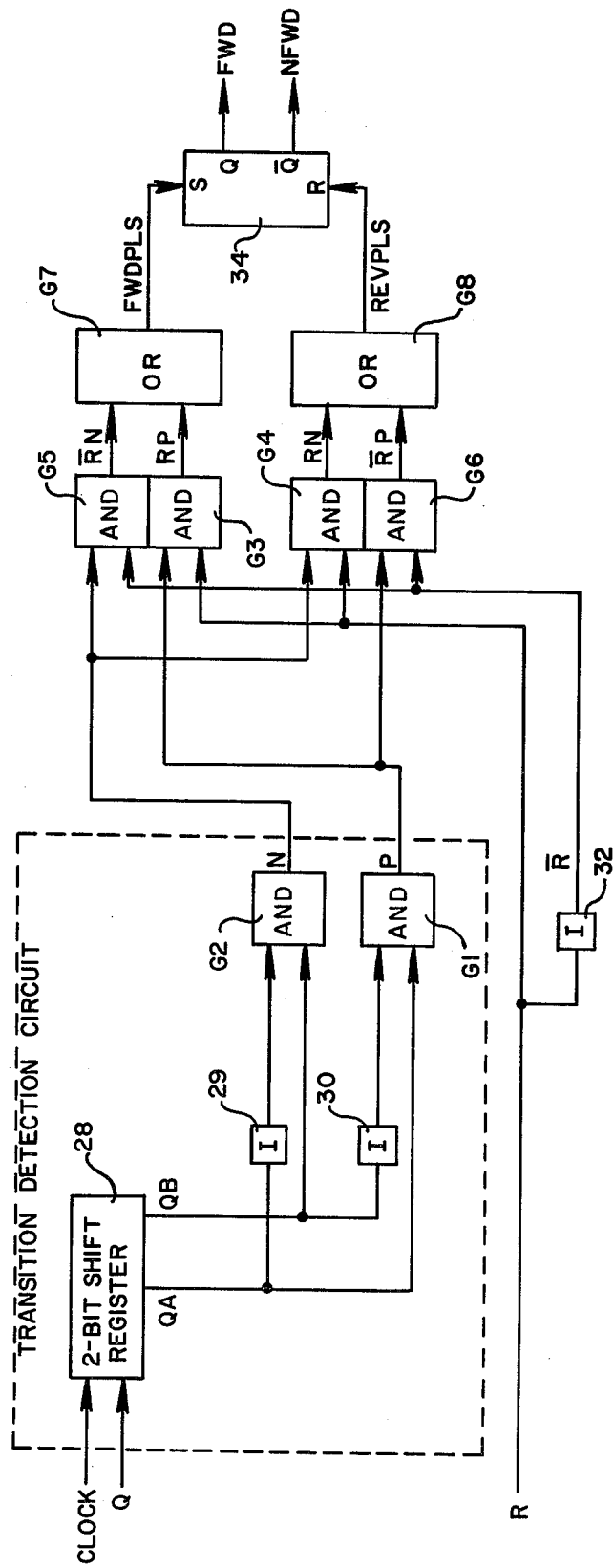
FIG. 2 illustrates a logic diagram of a preferred embodiment of the invention.

Referring to FIG. 1, a typical application for this invention which will be described with reference to FIG. 2, is for converting an absolute velocity, |velocity|, signal generated from a reference signal, R, and a quadrature signal, Q, by an absolute-velocity generator 10 into a velocity feedback signal by control of the polarity of the |velocity| signal transmitted through a polarity switch 11. The switch does not change the polarity of the |velocity| signal when a direction signal FWD is true, and inverts the polarity of the |velocity| signal when the direction signal FWD is not true. The signal FWD is generated by a circuit 12 for detecting the direction of motion from the signals R and Q.

A typical optical transducer which produces the two signals R and Q is comprised of a light source 13 which transmits light to a pair of sensors 14 and 15 through a movable scale 16 and stationary reticles 17 and 18. Amplifiers 19 and 20 couple the outputs of the sensors to respective signal conditioners 21 and 22 which produce the R and Q signals of the appropriate binary logic levels for processing in the circuit 12 for the detection of the direction of motion.

The scale illustrated is for linear motion and consists of a grating of equal width alternately transparent and opaque parallel lines. The reticles are stationary sections of the grating similar to that of the scale. One reticle is spaced from the other an odd number of half line widths so that regardless of the position of the scale relative to one reticle, the other is displaced a half line width in relation to the lines in the scale. As a consequence of that spacing, motion of the scale past the reticles modulates the light received by the sensors in phase quadrature such that for motion in either a forward (FWD) or reverse (REV) direction, a quasi-sinusoidal reference signal is produced by the light sensor 14 and amplifier 19. This is aptly referred to as a signal of phase X+0°, which may be any arbitrary value since the signal itself establishes a phase reference. At the same time the sensor 15 and amplifier 20 produce a signal of phase X−90° for forward motion and X+90° for reverse motion.

A signal conditioner 21 produces a square-wave reference signal R from a signal X+0 as shown in FIG. 3. The signal conditioner may be simply a high gain inverting or non-inverting threshold comparator. As shown in FIG. 3, the signal conditioner 21 is assumed to be an inverting comparator which converts the position reference signal X+0 to an appropriate logic signal. A signal conditioner 22 similarly converts the position quadrature signal X+90 to an appropriate logic signal, but in this case the signal is not inverted. However, that merely results in an effective phase shift of the reference signal by 180° without a corresponding phase shift in the resulting quadrature signal Q, as shown. As will be better appreciated after the circuit of FIG. 2 has been described, this phase shift of the reference signal relative to the quadrature signal is merely a matter of choice in the design of the circuit. In practice, the conditioner 22 could have been made inverting and the conditioner 22 noninverting, without affecting the design of the circuit, or both could have been made inverting (or noninverting) with only slight modification of the circuit.

Referring now to FIG. 2, the quadrature signal, Q, is first processed through a transition-detection circuit consisting of a 2-bit shift register 28, inverters 29 and 30, and AND gates G1 and G2 to produce a narrow pulse, P, at the output of the gate G1 for each low-to-high transition of the signal Q and a narrow pulse, N, at the output of the gate G2 for each high-to-low transition of the signal Q. The QA output of the first stage of the shift register is set (goes high) by a clock pulse immediately following a low-to-high transition of the quadrature signal Q. Since the QB output is still at a low logic level, the signal P which can be logically expressed as QA·$\overline{QB}$, changes to a high logic level. The QB output of the second stage of the shift register is set (goes high) by the next clock pulse which produces a low logic level at the output P. This produces a narrow pulse with a duration of one clock period at the output P for each low-to-high transition of the quadrature signal Q.

The QA output is reset (goes low) by a clock pulse immediately following a high-to-low transition of the quadrature signal Q. Since the QB output is still at a high logic level, the signal N, which can be logically expressed as $\overline{QA}$·QB, changes to a high logic level. The QB output is reset (goes low) by the next clock pulse which produces a low logic level at the output N. This produces a narrow pulse with a duration of one clock period at the output N for each high-to-low transition of the quadrature signal Q.

These P and N pulses are applied to a logic network which functions as a means for determining the direction of motion from the phase relationship of these pulses to the reference signal R which is applied directly to AND gates G3 and G4 for phase comparison with the P and N pulses respectively. If a pulse P occurs during a high logic level of the reference signal R, it is known that the direction of motion is forward. Similarly, if a pulse N occurs during a high logic level of the reference signal R, it is known that the direction of motion is reverse. Gates G3 and G4 thus produce respective logic signals R·P and R·N.

An inverter 32 provides the complement of the reference signal, $\overline{R}$, applied to AND gates G5 and G6. If a pulse N occurs during a high logic level of the signal $\overline{R}$, it is known that the direction of motion is forward. Similarly, if a pulse P occurs during a high logic level of the signal $\overline{R}$, it is known that the direction of motion is reverse. Gates G5 and G6 thus produce respective logic signals $\overline{R}$·N and $\overline{R}$·P which are combined by OR gates G7 and G8 with respective logic signals R·P and R·N to provide forward signal FWDPLS according to the logic R·P+$\overline{R}$·N and reverse signal REVPLS according to the logic $\overline{R}$·P+R·N. The forward signal continually sets a flip-flop 34 to provide a high signal FWD when the direction of motion is forward and the reverse signal resets the flip-flop 34 to provide a high signal NFWD when the direction of motion is not forward, i.e., is reverse.

Operation of the logic network of FIG. 2 will now be summarized with reference to FIG. 3. Assuming motion in the forward direction, each low-to-high transition of the quadrature signal Q occurs during the time the reference signal R is high, and each high-to-low transition occurs during the time the reference signal is low. As a consequence, the pulses P and N are gated by the gates G3, G5 and G7 to produce forward pulses, FWDPLS, which continually trigger the flip-flop 34 at its set (S) input to produce a forward signal FWD that is high. At any time that motion of the scale is stopped, the flip-flop will retain the direction last determined until motion is resumed. If it is again forward motion, the forward pulses will resume triggering the flip-flop at its set input, but if it is reverse motion, the forward pulses will not be generated because the P pulses are produced while the reference signal is low, and the N pulses are produced while the reference signal is high, as shown in FIG. 3. Instead, the gates G4, G6 and G8 generate reverse pulses, REVPLS, to trigger the flip-flop 34 at its reset (R) input. That sets the forward signal FWD low, and its complement NFWD high to indicate reverse motion.

From the timing diagram of FIG. 3 it is evident that the direction of motion is determined at each low-to-high and high-to-low transition of the quadrature signal. Consequently, regardless of where motion stops, once motion is resumed, its direction is determined in an average of one quarter cycle of the quadrature signal, but not more than one half cycle of the quadrature signal.

Although a particular embodiment of the invention has been described and illustrated herein, it is recognized that modifications and variations may readily occur to those skilled in the art. For example, the reference signal inverted by the signal conditioner could be noninverted and applied directly to the gates G5 and G6, but then obviously the noninverted reference signal would require inversion for the gates G3 and G4. In either case, the implementation of the logic network could obviously be effected in other ways; however, what is disclosed is regarded to be the best mode contemplated for practicing the invention. Nevertheless, since modifications and variations may be readily made, it is intended that the claims be interpreted to cover such modifications and variations.

We claim:

1. An electronic system for determining the direction of motion operating on two alternating signals from position transducers spatially displaced 90°, comprising separate means for converting each of the alternating signals into logic signals of one voltage level for each half cycle of one polarity and of another voltage level for each half cycle of opposite polarity, thereby producing a squarewave reference signal, R, from one alternating signal and a squarewave quadrature signal, Q, from the other alternating signal, said quadrature signal being +90° or −90° out of phase with the reference signal depending upon the direction of motion being sensed by said transducer, circuit means responsive to said quadrature signal for producing a pulse, P, at each signal level transition of a given polarity and a pulse, N, at each signal level transition of opposite polarity, logic means responsive to said reference signal R and to said pulses P and N to produce a forward signal, FWDPLS, for one quadrature phase relationship of the logic signals R and Q according to the logic function $$FWDPLS = RP + \overline{R}N$$

logic means responsive to said reference signal R and to the pulses P and N to produce a reverse signal, REVPLS, for another quadrature phase relationship of the logic signals R and Q according to the logic function $$REVPLS = RN + \overline{R}P.$$

2. Apparatus as defined by claim 1 including bistable means for storing each pulse of said forward signal, thereby to provide a steady-state output signal FWD in response to each pulse in said forward signal, and to store each pulse of said reverse signal, thereby to provide a complementary steady-state output signal NFWD in response to each pulse of said reverse signal, thus providing a steady-state signal FWD for motion sensed by said transducer in one direction and a steady-state signal NFWD for motion sensed by said transducer in the opposite direction such that at any time that motion is stopped, the signal indicative of the last direction determined is retained by said bistable means until motion again occurs and its direction is positively determined within a maximum of one half cycle of said quadrature signal.

3. Apparatus for determining direction of motion from signals produced by a motion transducer wherein the polarity of a reference signal, R, alternates with every fixed increment of motion of a transducer and a quadrature signal, Q, which alternates 90° out of phase with the reference signal, leads or lags the reference signal according to whether the motion is forward or reverse, comprising digital means for producing a narrow pulse, P, at each low-to-high transition of said quadrature signal and a narrow pulse, N, at each high-to-low transition of the quadrature signal; means responsive to said P and N pulses and said reference signal for determining direction of motion once during each half cycle of the reference signal according to the logic functions $RP + \overline{R}N$ for forward motion and $RN + \overline{R}P$ for reverse motion, and means for storing each direction determination until a subsequent determination is made in order to provide a continuous signal indicative of the direction of motion.

* * * * *